United States Patent [19]

Saimoto

[11] Patent Number: 5,082,463
[45] Date of Patent: Jan. 21, 1992

[54] BUSBAR INTERCONNECTING STRUCTURE

[75] Inventor: Tetsuro Saimoto, Kosai, Japan

[73] Assignee: Yazaki Corporation, Tokyo, Japan

[21] Appl. No.: 567,522

[22] Filed: Aug. 15, 1990

[30] Foreign Application Priority Data

Aug. 24, 1989 [JP] Japan .................... 1-97937[U]

[51] Int. Cl.⁵ .................................. H01R 31/08
[52] U.S. Cl. ...................................... 439/883
[58] Field of Search ............. 439/76, 74, 75, 510, 439/883, 884; 174/72 B; 361/406, 407, 408, 414

[56] References Cited

U.S. PATENT DOCUMENTS

| | | | |
|---|---|---|---|
| 4,001,490 | 1/1977 | Lynch | 439/510 |
| 4,735,588 | 4/1988 | Bird et al. | 439/816 |
| 4,781,621 | 11/1988 | Sugiyama et al. | 439/559 |

FOREIGN PATENT DOCUMENTS 0130844 3/1986 European Pat. Off. .
1471520 1/1967 France .
54-101489 7/1979 Japan .................... 439/510

Primary Examiner—Neil Abrams
Attorney, Agent, or Firm—Armstrong, Nikaido, Marmelstein, Kubovcik & Murray

[57] ABSTRACT

A busbar interconnecting structure consists of a tab formed integral with one busbar and a slot formed in another busbar. The two busbars are firmly connected by pressing the tab into the slot. The slot has the inner surfaces of its shorter sides formed in an arc so that even when the tab is inserted misaligned into the slot, a four-point contact is obtained at all times between the tab and the slot. The slot is also provided at the shorter sides with risers whose inner surfaces are also formed in an arc shape to increase the contact area between the tab and the slot, thus assuring a more stable electrical contact. The tab, when viewed in cross section, may be rounded at the shorter sides to match the curvature of the internal arc surfaces of the slot, thereby providing a still more stable surface contact.

4 Claims, 4 Drawing Sheets

BUSBAR INTERCONNECTING STRUCTURE

BACKGROUND OF THE INVENTION

The present invention relates to a busbar interconnecting structure in which two busbars are securely joined together.

PRIOR ART

A method currently available for joining busbars involves pressing a tab 3, rectangular in cross section, of one busbar 1' into a rectangular slot 2 of another bus bar 1, as shown in FIGS. 8A and 8B. The slot 2 is provided with risers 4 to increase the contact area between the tab 3 and the busbar 1.

Since the contact surfaces of the risers 4 are plane, a large contact area is obtained when the tab 3 is inserted under pressure in such a manner that tab's longitudinal axis is perpendicular to the contact surfaces of the risers 4. However, when the tab 3 is inserted slantwise at an angle of α as shown, only the diagonal corners P, P' of the tab 3 come into contact with the riser surfaces (i.e., two-point contact is made), providing only a small-area contact, which in turn increases electric resistance and makes the joint unstable.

SUMMARY OF THE INVENTION

It is an object of the invention to provide a busbar interconnecting structure which securely joins two busbars through a stable four-point contact, regardless of whether there is a twist angle at which a tab of one busbar is inserted into a slot of another busbar.

In a busbar interconnecting structure in which a tab formed integral with one busbar is pressed into a slot formed in another busbar, the above objective can be achieved by forming the inner surfaces of shorter sides of the slot at both ends into an arc.

When risers are provided to the slot, their inner surfaces are also formed in an arc to increase the contact area. The radius of the arc is preferably set to about one-half the longitudinal length of the slot. It is also desired that the end surfaces of the tab to be inserted into the slot be formed into arc so that the mating surfaces of the tab and the slot snugly fit each other.

With this invention, since the inner surfaces of the both ends of the slot are formed in an arc, the insertion of a tab of a rectangular cross section results in a four-point contact, securing a stable electrical connection, even when the tab is inserted inclined with respect to the accommodating slot. If the ends of the tab, when viewed in cross section, are also formed in arc, they will come into a surface contact with the mating, inner arc end surfaces of the slot, providing a more firm and stable connection.

This connection structure permits the manufacture of a laminated busbar printed circuit board with enhanced reliability.

PREFERRED EMBODIMENT OF THE INVENTION

Figure 2:
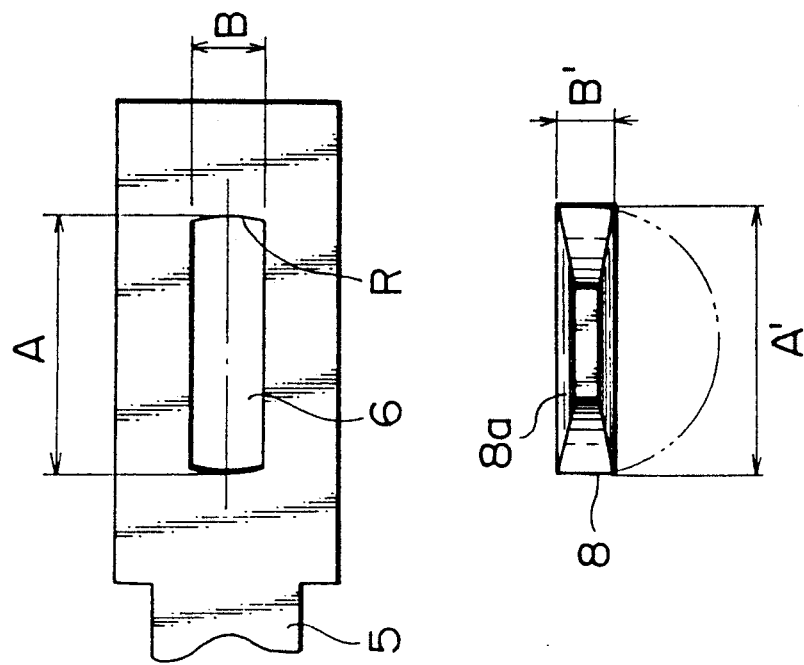
FIG. 2 is plan views of a slot and a tab of FIG. 1.
Figure 1:
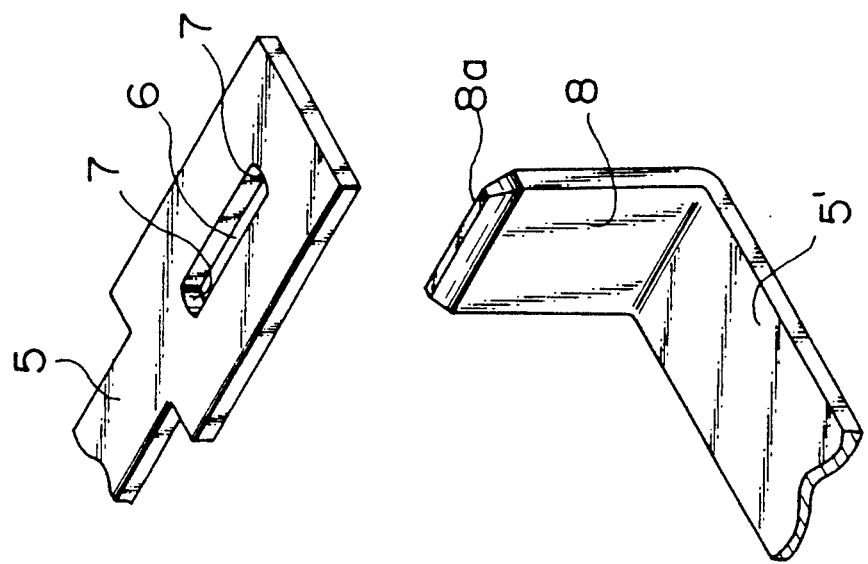
FIG. 1 is an exploded perspective view of a connecting structure according to this invention.

Referring to FIG. 1, a busbar 5 has a slot 6 formed therein whose shorter sides at the ends are formed into arcs 7 at the inner surface. The radius of arc surfaces 7, as shown in FIG. 2, is preferably set to approximately one-half the length A of a slot 6. A tab 8 of another busbar 5' to be pressed into the slot 6 of the first busbar 5 has a rectangular cross section with its front end chamfered at 8a. When viewed in cross section, the width A' of the tab 8 is set slightly larger than the length A of the slot 6 (A < A') and the width B of the slot 6 is formed slightly larger than the thickness B' of the tab 8 (B > B').

Figure 3:
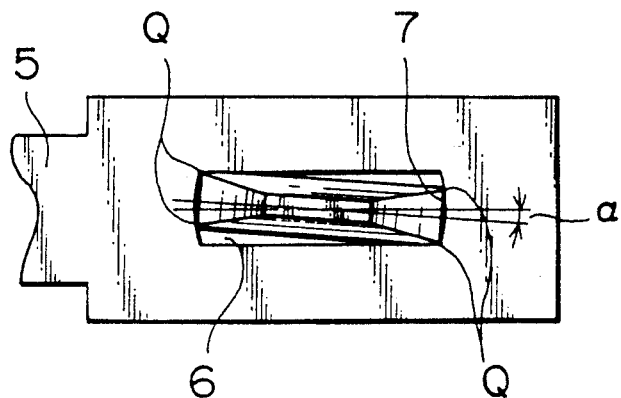
FIG. 3 is a plan view of the connecting structure of FIG. 1 with the tab and the slot joined together under pressure.

Even when, as shown in FIG. 3, the tab 8 is pressed misaligned into the slot 6 with a twisting angle of α between them, all the four corners Q of the tab 8 come into contact with the mating arc inner surfaces 7 at the ends of the slot 6 because the inner surfaces 7 are formed in arc. It is readily understood that, regardless of whether there is any twisting angle between the tab 8 and the slot 6 when the former is inserted, there is always a four-point contact between them, thus providing a stable electrical connection.

When the tab 8 is pressed correctly aligned into the slot 6, the tab 8 is compressed by the slot 6 because of the relationship of A < A', resulting in a virtual surface-contact between the tab end surfaces and the arc inner surfaces 7.

Figure 4:
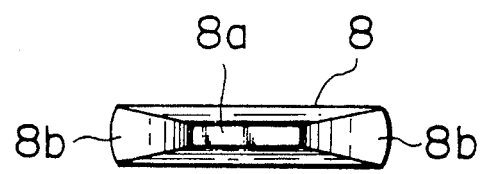
FIG. 4 is a plan view of another example of a tab according to this invention.

Therefore, by forming the both end surfaces of the tab 8 into arcs 8b that match the arc inner surfaces 7 of the slot 6 as shown in FIG. 4, it is possible to obtain a still more secure surface contact.

Figure 5:
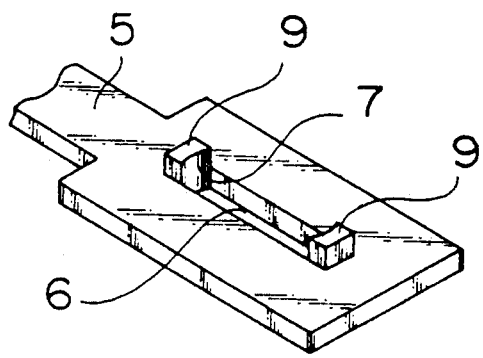
FIG. 5 is a perspective view of another embodiment of this invention.

FIG. 5 shows risers 9 formed by punching at each end of the slot 6 of FIG. 1 whose inner surfaces are formed in an arc 7. This structure not only provides the stable four-point contact but also increases the area of contact.

Figure 6:
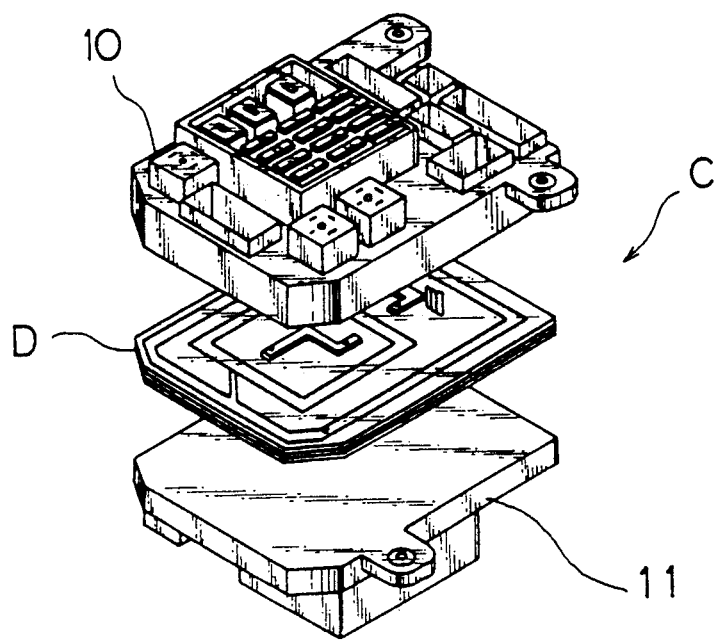
FIG. 6 is an exploded perspective view of an electric junction box employing the connecting structure of this invention.

FIG. 6 shows an electric junction box that utilizes the connecting structure of this invention. In the figure, reference numeral 10 represents a main cover for the electric junction box C, and 11 represents an undercover, with a laminated busbar printed circuit board D accommodated inside the box.

Figure 7A:
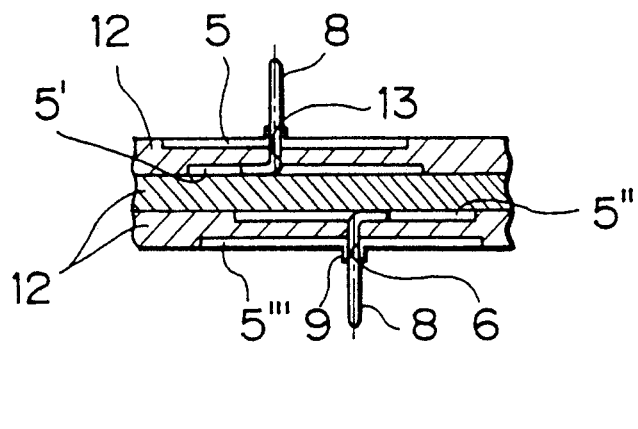
FIGS. 7A and 7B are enlarged partial cross section and perspective views, respectively.
Figure 7B:
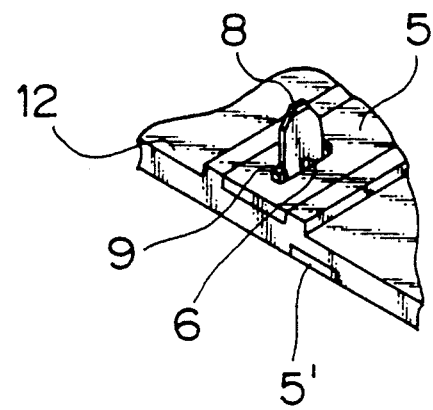
Figure 8A:
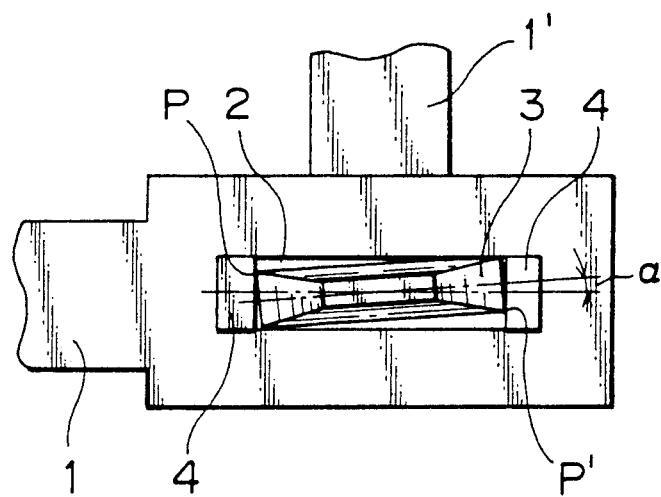
FIGS. 8A and 8B are plan and cross sectional views of a conventional connecting structure.
Figure 8B:
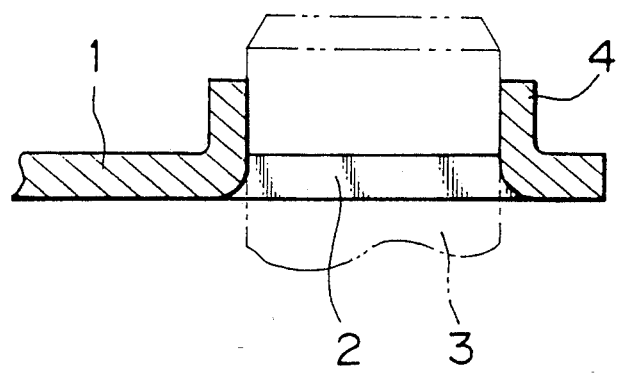

The printed circuit board D, as shown in FIGS. 7A and 7B, consists of busbars 5, 5', . . . and insulating boards 12 stacked in tiers.

The tabs 8 of the busbar 5' in the second layer and of the busbar 5" in the third layer pass through the corresponding through-holes 13 in the insulating boards 12 and then are pressed into the slots 6 formed in the first layer busbar 5 and the fourth layer busbar 5", each of which is provided with risers 9.

Since the slot 6 or the risers 9 are formed with the aforementioned arc surfaces 7, a firm four-point contact can be obtained even when there are some dimensional errors between the printed circuit boards at different layers. This obviates the need to pay special attention to the attitude in which the tab is inserted under pressure during the board laminating and assembling process, which in turn improves work efficiency and ensures high-quality laminated busbar printed circuit boards.

As described above, in the process of interconnecting busbars by inserting tabs into slots under pressure, this invention permits stable connection at all times between the busbars even when there are some errors in dimensions or insertion attitude, thereby making it possible to improve the work efficiency in assembling the laminated busbar printed circuit boards and to provide products with highly reliable electrical connections.

What is claimed is:

1. A busbar interconnecting structure comprising:
   a tab formed integral with a first busbar, said tab having a cross-section of elongate form defined by a pair of opposed long sides joined at their ends by a pair of opposed short sides with each short side formed as an arc; and
   a slot formed in a second busbar, said slot being of elongate form and having a pair of opposed long straight sides joined at their ends by a pair of opposed short sides with each short side formed as an arcuate surface and a width between said opposed long sides of said slot slightly larger than a thickness measured between said opposed long sides of said cross-section of said tab; whereby said tab may be inserted under pressure into said slot to form a secure connection between said first and second busbars including pressure engagement of portions of said tab with said arcuate surfaces of said slot and the long sides of said slot adjacent the long sides of said tab.

2. A busbar interconnecting structure as claimed in claim 1, wherein the slot is provided at the shorter sides with risers whose inner surfaces are formed as arcuate surfaces.

3. A busbar interconnecting structure as claimed in claim 1 or 2, wherein shorter sides comprising end surfaces of the tab, when viewed in cross section, are formed as arcuate surfaces which match the arcuate surfaces of the shorter sides of the slot.

4. A busbar interconnecting structure as claimed in claim 1 or 2, wherein the radius of the arcuate surfaces at the shorter sides of the slot is about one-half the longitudinal length of the slot.

* * * * *